(12) United States Patent
Shum

(10) Patent No.: US 7,439,548 B2
(45) Date of Patent: Oct. 21, 2008

(54) SURFACE MOUNTABLE CHIP

(75) Inventor: Frank T. Shum, Sunnyvale, CA (US)

(73) Assignee: Bridgelux, Inc, Sunnyvale, CA (US)

( * ) Notice: Subject to any disclaimer, the term of this patent is extended or adjusted under 35 U.S.C. 154(b) by 41 days.

(21) Appl. No.: 11/502,940

(22) Filed: Aug. 11, 2006

(65) Prior Publication Data
US 2008/0035935 A1    Feb. 14, 2008

(51) Int. Cl.
*H01L 27/15* (2006.01)
(52) U.S. Cl. ............................. 257/81; 257/79; 257/99; 257/100; 257/E33.057; 257/E33.044
(58) Field of Classification Search ............... 257/81, 257/84, 88, 99, 100, 79, E33.044, E33.057
See application file for complete search history.

(56) References Cited
U.S. PATENT DOCUMENTS
5,696,389 A    12/1997   Ishikawa et al.
6,599,768 B1 *  7/2003   Chen .......................... 438/22
2004/0120155 A1  6/2004   Suenaga
2005/0211997 A1 *  9/2005   Suehiro et al. ................ 257/88
2006/0043402 A1 *  3/2006   Suehiro et al. ................ 257/99
2006/0261364 A1 * 11/2006   Suehiro et al. .............. 257/100

* cited by examiner

*Primary Examiner*—Andy Huynh
(74) *Attorney, Agent, or Firm*—Calvin B. Ward

(57) ABSTRACT

A surface mountable device having a circuit device and a base section. The circuit device includes top and bottom layers having a top contact and a bottom contact, respectively. The base section includes a substrate having a top base surface and a bottom base surface. The top base surface includes a top electrode bonded to the bottom contact, and the bottom base surface includes first and second bottom electrodes that are electrically isolated from one another. The top electrode is connected to the first bottom electrode, and the second bottom electrode is connected to the top contact by a vertical conductor. An insulating layer is bonded to a surface of the circuit device and covers a portion of a vertical surface of the bottom layer. The vertical conductor includes a layer of metal bonded to the insulating layer.

16 Claims, 12 Drawing Sheets

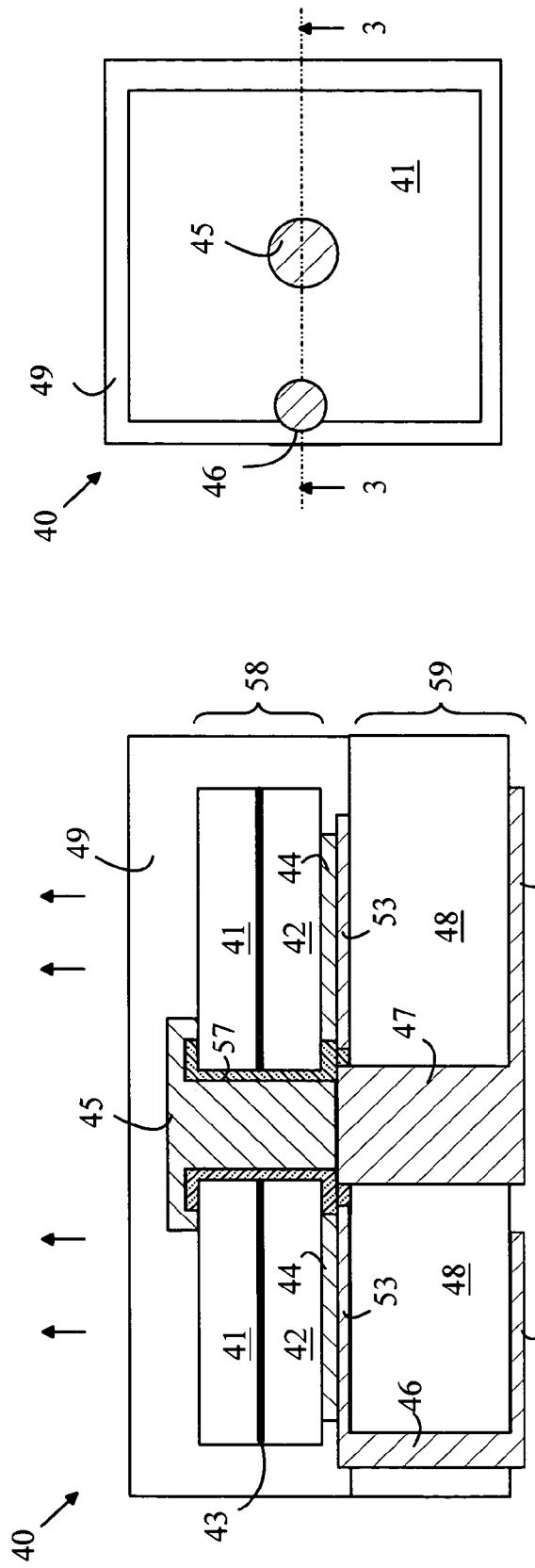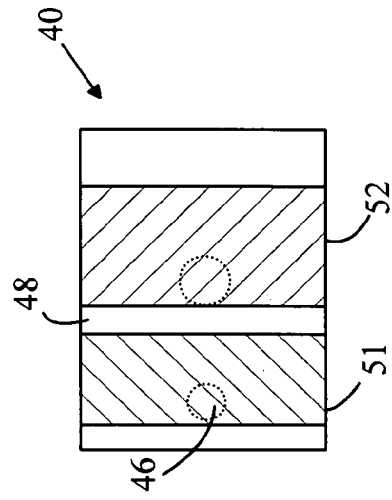

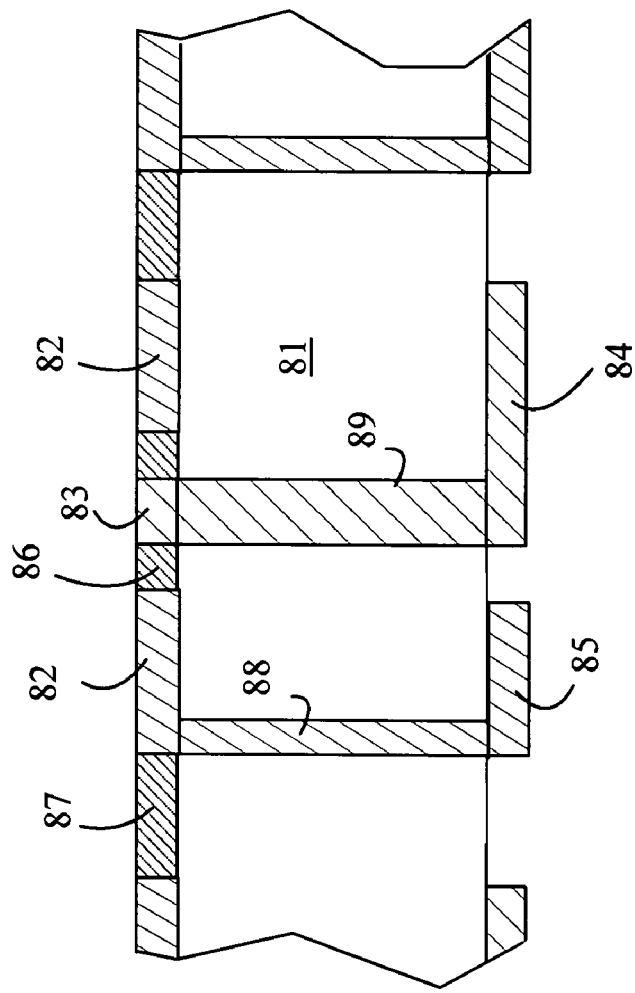
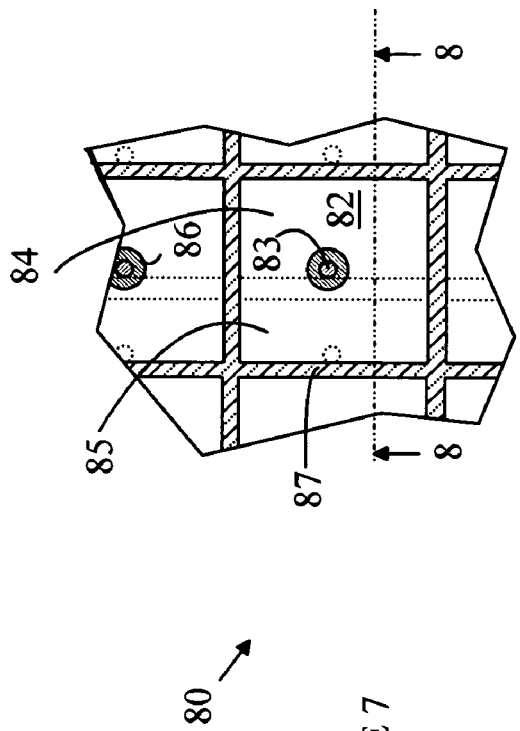
FIGURE 7
FIGURE 8

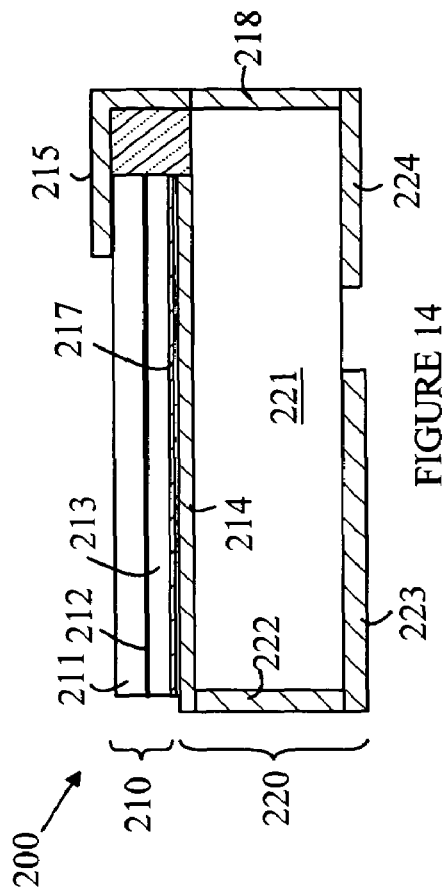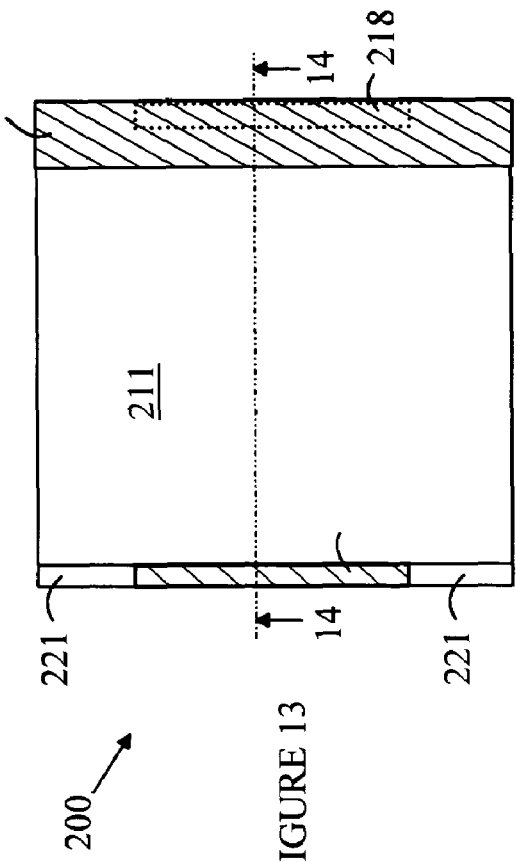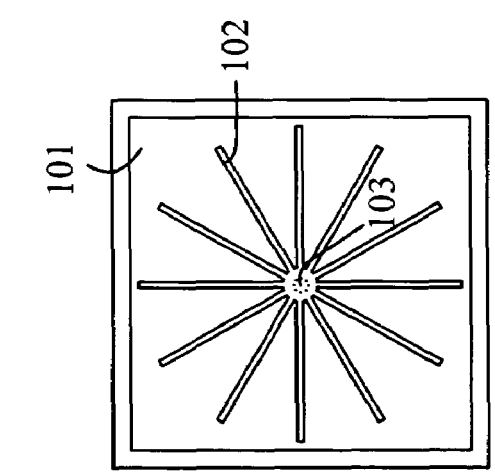

SURFACE MOUNTABLE CHIP

BACKGROUND OF THE INVENTION

Advances in light-emitting diodes (LEDs) have made light sources constructed from such devices attractive alternatives to conventional light sources such as fluorescent lights and incandescent lights. LED-based light sources have energy conversion efficiencies approaching or exceeding those of these conventional light sources. In addition, the LED-based light sources have lifetimes that far exceed those of these conventional light sources. For example, a fluorescent light source has a lifetime of about 10,000 hours whereas an LED has a lifetime of 100,000 hours. In addition, fluorescent light sources tend to fail completely without warning. In contrast, LED-based light sources tend to fade, and hence, the user has adequate warning before it completely fails.

Unfortunately, LEDs have some drawbacks when used to replace conventional light sources. First, LEDs emit light in relatively narrow spectral bands, and hence, to provide a source that is perceived to have an arbitrary color, a number of LEDs that emit different narrow spectral lines must be packaged together or the LED must be covered with one or more phosphors that are excited by the LED to provide the desired output spectrum.

In addition, a single LED has only a limited light output. Even high-power LEDs are limited to a few watts at best. In addition, as noted above, to provide an arbitrary output spectrum a number of LEDs must be combined into a single light-emitting element. Hence, to provide a light source having an output of more than a few watts in any spectral band, a number of LEDs must be combined into a single unit.

To provide such multi-LED devices, a number of LED dies are normally connected to some form of substrate. The connection schemes can be divided into two broad categories. The first category relies on wire bonds to connect one or more of the electrodes on the die to corresponding electrodes on the substrate. These schemes have a number of problems. First, the wire bonds must be individually applied. Second, the wire bonds must be protected due to their fragile nature. The protection typically involves potting the die and wire bonds in some clear encapsulant. Unfortunately, the encapsulant can age causing light absorption. In addition, the encapsulant stresses the wire bond, which can lead to premature device failure. Further, the encapsulation is an additional assembly step that results in additional cost. Moreover, the encapsulant often imposes maximum temperature constraints on the device. In addition, encapsulants can stress the LED materials causing increases in the required operating voltage. Third, the wire bonds typically block part of the light emitted by the LEDs, and hence, reduce the efficiency of the light source. Finally, it should be noted that wire bond failures are a significant source of the overall device failures.

The second category of connection schemes, in principle, avoids the wire bonds, and hence, the problems associated with those bonds. These schemes are commonly referred to as flip-chip schemes. In these schemes, the LED is fabricated on a transparent substrate by depositing a number of layers on the substrate. Since the layers needed to construct an LED are well known in the art, these layers will not be discussed in detail here. For the purposes of the present discussion, it is sufficient to note that an LED has three major layers, an n-type layer that is usually deposited first on the substrate, an active layer that generates the light, and a p-type layer. Electrons flow from the n-type layer into the active region where the electrons combine with holes that flow into the active layer from the p-type layer.

To power the LED, a potential must be provided between the n-type layer and the p-type layer. But the n-type layer is buried within the multi-layer stack. There are two basic configurations used to deal with this connection problem. In the first configuration, the n-type and p-type connections are made through electrodes that reside on the outer surfaces of these layers. This type of device will be referred to as a "vertical device" in the following discussion. The second type of device is referred to as a "lateral device". In a lateral device, the connection to the buried layer is provided by etching the layer above it to expose the buried layer. In the example discussed above, the p-type layer and the active layer are removed in part of the device to expose the underlying n-type layer. A connection is then provided to the p-type layer by depositing a metal film on the exposed layer. In a device that is connected via wire bonds, one of the wire bonds is affixed to this metal film. The device is referred to as a lateral device because the current must flow laterally from the exposed mesa to reach the active layer. A flip-chip LED is an example of such a lateral device.

In a flip-chip LED, the connection to the n-type layer is provided by etching the p-type and active layers in one area of the device to expose the n-type layer. A conducting layer is then deposited on the exposed n-type layer mesa and used to make the connection to that layer. To mount the chip on a carrier such as a printed circuit board, the chip is turned upside down such that the contacts on the top of the LED will mate with pads on the printed circuit board. The chip is then bonded to the printed circuit board.

While flip-chip LEDs avoid the problems associated with wire bonding, they introduce a new set of problems. First, the chips must be placed on a printed circuit board, or the like. The precision required in this operation is high, since the contacts are very small and close together. The final product manufacturer may not have the equipment needed to make this type of precise placement in an economical manner. Hence, these devices are often packaged on a separated carrier that is analogous to a small printed circuit board that has pads that are further apart, and hence, reduces the precision with which the final product manufacturer must place the device. Unfortunately, this solution increases the size of the packaged device, and hence, limits the density of LEDs in the final product. In addition, this solution increases the cost of the final LED, since the LEDs must be individually connected to the carrier.

Second, the bonding of the flip chip to the carrier, whether the final printed circuit board or the above-described intermediate carrier, involves processing steps that can lead to shorts between the layers of the LED. These shorts can occur at the time of bonding or during the life of the device. The shorts increase the cost of the LEDs by reducing yields.

Third, the mesa that is cut to provide the n-type contact occupies a significant fraction of the surface area of the die. This area does not produce light, since the mesa must be cut through the active layer. Hence, the total light per unit area leaving the device is significantly reduced.

SUMMARY OF THE INVENTION

The present invention includes a device having a circuit device and a base section. The circuit device includes a plurality of semiconductor layers including a top layer and a bottom layer. The top layer includes a top surface having a top contact thereon, and the bottom layer includes a bottom surface and a bottom contact on the bottom surface. The circuit device requiring a potential difference between the top contact and the bottom contact to operate. The base section includes a substrate having a top base surface and a bottom base surface. The top base surface is bonded to the bottom layer, and the bottom base surface includes first and second bottom electrodes that are electrically isolated from one another. The bottom contact is connected to the first bottom electrode by a first conductor and the second bottom electrode is connected to the top contact by a second conductor. The bottom layer includes an insulating layer bonded to a surface thereof, and the second conductor includes a layer of metal bonded to the insulating layer, the insulating layer preventing contact between the second conductor and the bottom layer.

The present invention can be used to construct a surface mountable light emitting device in which the light emitting device includes an active layer, and first and second semiconductor layers, the active layer being disposed between the first and second semiconductor layers. The first layer has a top surface that includes the top contact, and the second layer has a bottom surface that includes the bottom contact. The light-emitting device generating light when holes and electrons combine therein in response to a potential that is applied between the top and bottom contact.

BRIEF DESCRIPTION OF THE DRAWINGS

FIG. 2 is a top view of one embodiment of an LED according to the present invention.

FIG. 3 is a cross-sectional view through line 3-3 shown in FIG. 2.

FIG. 4 is a bottom view of LED 40.

FIG. 7 is a top view of a portion of a base section for a number of devices.

FIG. 8 is a cross-sectional view through line 8-8 shown in FIG. 7.

FIG. 12 is a top view of another embodiment of an LED according to the present invention.

FIG. 13 is a top view of another embodiment of an LED according to the present invention.

FIG. 14 is a cross-sectional view through line 14-14 shown in FIG. 13.

DETAILED DESCRIPTION OF THE PREFERRED EMBODIMENTS OF THE INVENTION

The present invention can be more easily understood with reference to an LED. However, as will be explained in more detail, the present invention can be used to construct a number of different circuit devices having base sections that are substantially the same size as the integrated circuit chip. The base sections serve a function analogous to the sub-mounts discussed above but without the limitations discussed above.

Figure 1:
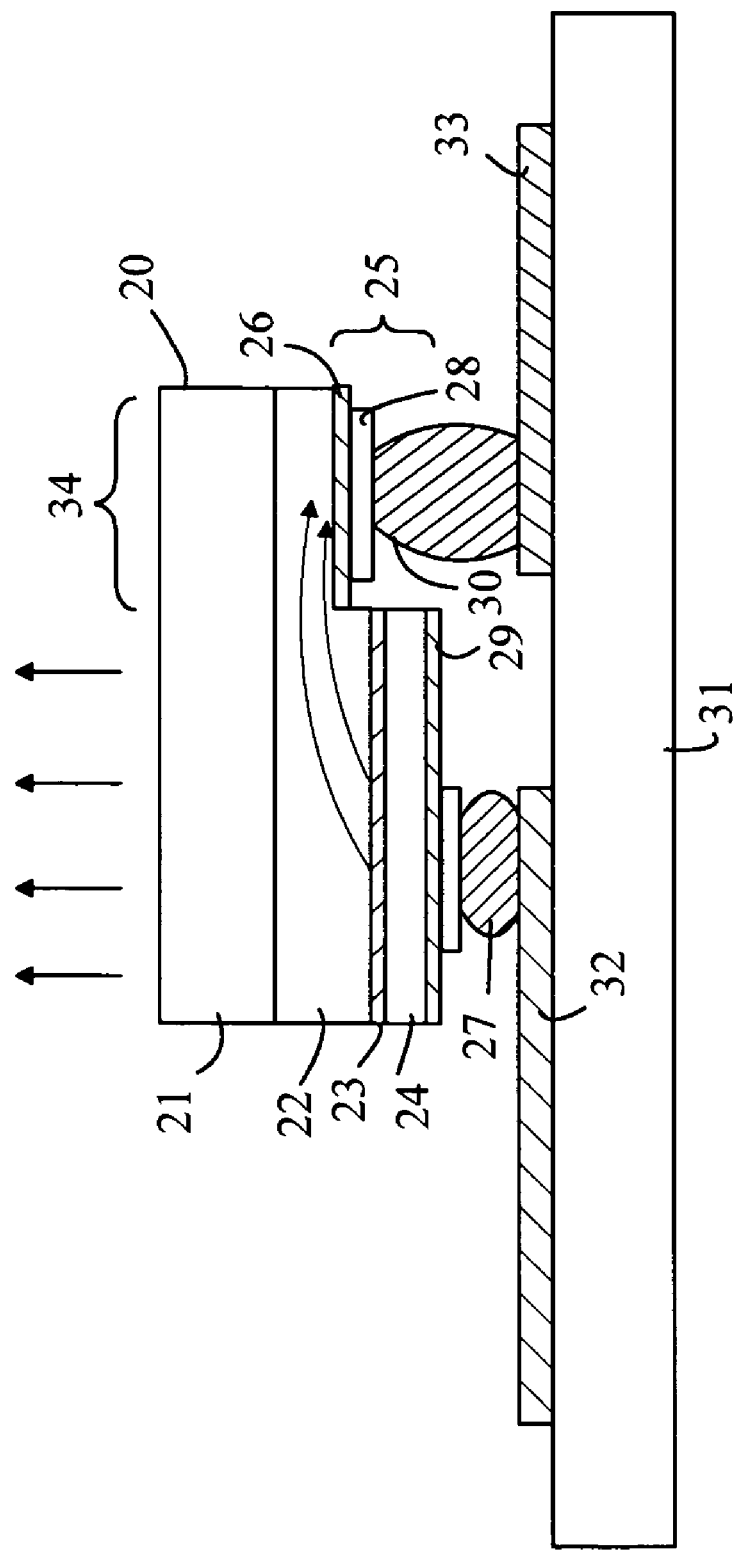
FIG. 1 is a cross-sectional view of flip-chip LED 20 mounted on a printed circuit board.

The manner in which an LED according to the present invention provides its advantages can be more easily understood with reference to FIG. 1, which is a cross-sectional view of flip-chip LED 20 mounted on a printed circuit board 31. LED 20 is fabricated on a transparent substrate 21 by depositing an n-type layer 22, an active layer 23, and a p-type layer 24 as described above. A reflecting electrode 29 is deposited over layer 24 and acts both as an electrical contact for spreading the current over layer 24 and as a mirror for reflecting light that is generated in the active layer in a direction toward electrode 29. Electrode 29 is connected to a corresponding electrode 32 on printed circuit board 31 by a solder ball 27.

As noted above, to provide the electrical connection to layer 22, a mesa is etched in the stack of layers as shown at 25. An electrode 26 is deposited on this mesa and connected to a corresponding electrode 33 on printed circuit board 31 via electrode 28 and solder ball 30.

The size of mesa 25 is preferably as small as possible, since area 34 over the mesa does not generate any light, and hence, represents wasted space from the point of view of light generation. On the other hand, mesa 25 must be large enough to accommodate solder ball 30. As a result, mesa 25 is typically, 30 percent of the die surface area, and the maximum light output is reduced accordingly.

It should also be noted that the arrangement shown in FIG. 1 is less than optimum from the point of view of current spreading in layer 22. Ideally, the n-type contact would provide uniform current flow across active region 23. However, the arrangement shown in FIG. 1 has a non-uniform current flow in which the areas nearest the mesa receive more current than areas that are further away from the mesa.

In addition, the light generated by LED 20 must exit through the substrate 21. The choice of materials for substrate 21 is constrained by the lattice constant of the materials used for layer 22, which, in turn, are determined by the desired optical spectrum that is to be generated by LED 20.

Refer now to FIGS. 2-4, which illustrate an LED according to the present invention. FIG. 2 is a top view of LED 40; FIG. 3 is a cross-sectional view of LED 40 through line 3-3 shown in FIG. 2, and FIG. 4 is a bottom view of LED 40. LED 40 can be viewed as including two main sections, a light emitting section 58 and a base section 59 that are bonded together. It should be noted that LED 40 is a vertical device, and hence, the above-described problems with lateral devices are avoided.

Light-emitting section 58 includes an n-layer 41 and a p-layer 42 that sandwich an active layer 43 that emits light when holes and electrons injected from the layers 42 and 41, respectively, combine therein. As noted above, each of these layers may include a number of sub-layers; however, since those sub-layers are not the focus of the present invention, their function will not be discussed in detail here. Power is applied between layers 41 and 42 via electrodes 45 and 44, respectively. To protect light-emitting section 58 from the environment, a clear insulating layer 49 is applied to complete the encapsulation of light-emitting section 58.

Base section 59 can be viewed as providing a number of metal traces on and through an insulating substrate 48. Base section 59 provides two functions. First, base section 59 provides connections between electrodes 44 and 45 and coplanar contacts 51 and 52, respectively, on the bottom of LED 40. The connection between electrode 44 and contact 51 is provided by a vertically running metal trace 46 that connects metal layer 53 to contact 51. Metal layer 53 is bonded to electrode 44.

The connection between electrode 45 and contact 52 is provided by a metal filled via 47. It should be noted that electrode 45 could also be a metal filled via. This via extends through the light-emitting section 58 and is insulated from the active layer 43 and p-layer 42 by a layer of insulating material shown at 57.

Base section 59 also provides structural support to LED 40. Light emitting section 58 typically has a thickness that is less than 5 µm. Hence, the light emitting section is too fragile to survive the handling and bonding operations needed to attach LED 40 to many products. Base section 59 is typically 100 µm thick.

In addition, base section 59 provides mounting pads that are sufficiently large to allow LED 40 to be surface mounted to a printed circuit board, or the like. As will be discussed in more detail below, the cross-section of electrode 45 is preferably as small as possible. Hence, the alignment of electrode 45 and 47 requires some precision. As will be explained in more detail below, the necessary precision can be provided by using a separate base section, which can, in turn, be attached to the printed circuit board with a lower degree of precision.

As noted above, the size of electrode 45 is preferably set to be as small as possible. The portion of the light-emitting section that is consumed by electrode 45 does not generate a significant amount of light that will escape from the top surface of LED 40. Hence, minimizing the cross-section of electrode 45 maximizes the total light output. However, electrode 45 must be larger than some minimum size that is set by one of several considerations. First, the diameter of the via through layers 41-43 has a minimum size that is set by the etching system used to construct the via. In general, there is a maximum aspect ratio that can be obtained in the via opening process. This aspect ratio is typically less than 10:1. That is, the via can not have a depth that is greater than 10 times its diameter. The depth of the via in this case is the thickness of layers 41-43 which, as noted above, is typically less than 5 µm. Hence, the vias can be less than 1 µm.

The second consideration is the resistance of electrode 45. In high power LEDs, electrode 45 is required to conduct a current that is greater than 350 mA without introducing a significant voltage drop. Since the resistance of the conduction path is inversely proportional to the cross-sectional area of the via, the required current flow sets another limit on the cross-section of electrode 45. To some extent, this limitation can be overcome by utilizing a metal that has a higher conductivity such as copper or gold; however, there is still a lower limit on the cross-sectional area of the via. In high current applications, the via is typically larger than 50 µm.

Figure 6:
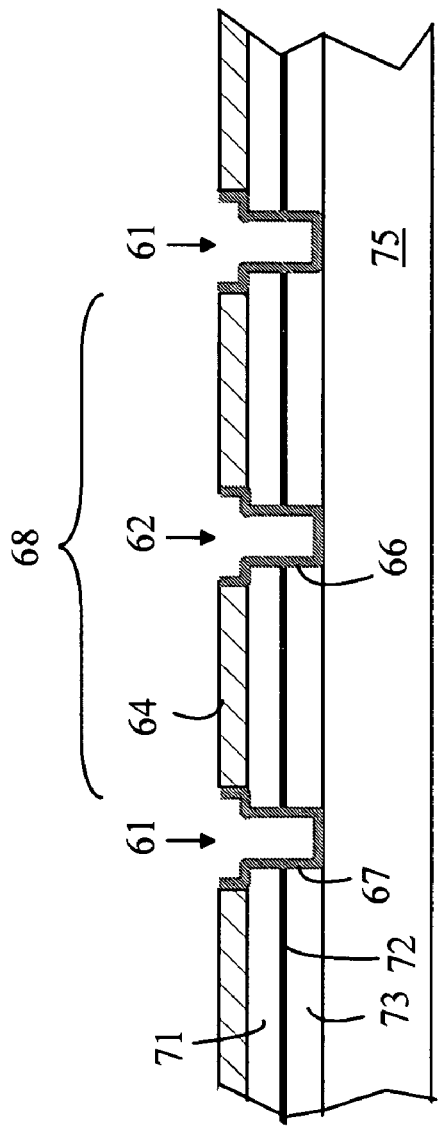
FIG. 6 is a cross-sectional view through line 6-6 shown in FIG. 5.
Figure 5:
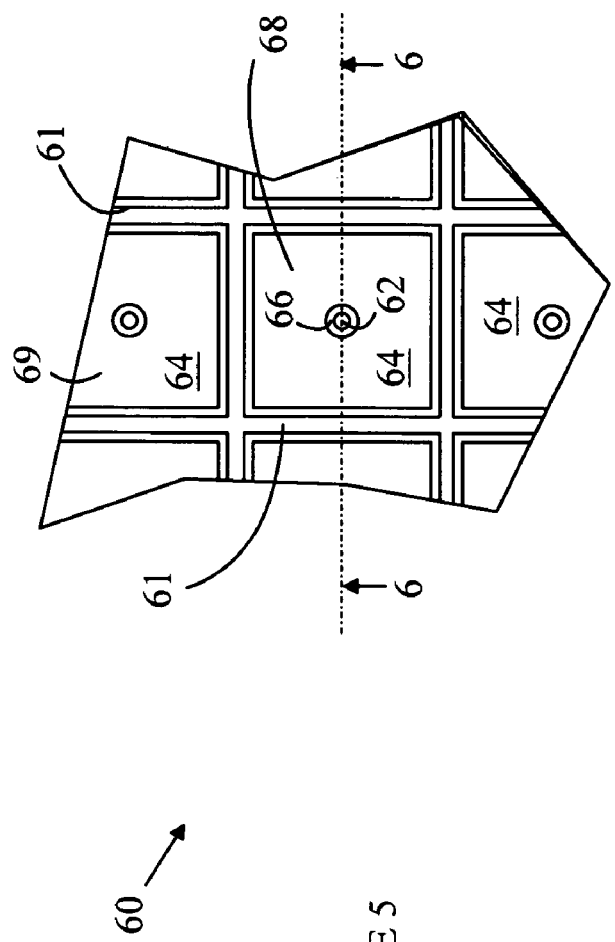
FIG. 5 is a top view of a portion of wafer having a plurality of LEDs.

The manner in which an LED according to one embodiment of the present invention is fabricated will now be discussed in more detail. As noted above, an LED according to the present invention can be viewed as being made up of a light emitting section and a base section that are bonded together. Refer now to FIGS. 5 and 6, which illustrate the manner in which the light-emitting section is fabricated. FIG. 5 is a top view of a portion of a wafer 60 having a plurality of LEDs. Exemplary LEDs are shown at 68 and 69. FIG. 6 is a cross-sectional view of a portion of wafer 60 through line 6-6 shown in FIG. 5.

First, the n-type layer 73, p-type layer 71, and active layer 72 are deposited on a substrate 75. A metal layer is then deposited over the p-type layer and patterned to provide the p-electrodes 64. This metal layer may include multiple sub layers that provide various functions such as solderabiltiy and adhesion. In addition, the appropriate choice of sub-layer materials can provide an electrode that acts as a highly reflective mirror. Since such structures are known to the art and are not central to the present invention, they will not be discussed in detail here. The reader is referred to U.S. Pat. Nos. 6,552,359, 5,585,648, 6,492,661, and 6,797,987 for the details of such functionality.

The semiconductor layers are then etched to provide boundary regions 61 and vias 62. The boundary regions separate the various LEDs from one another and include the scribe lanes that will eventually be used when the final product is singulated. The vias are lined with an insulating material 66. The boundary regions can also be lined with this insulator as shown at 67. The lining of the boundary regions is optional. This lining is included to simplify the fabrication process by eliminating the masking steps that would be necessary to prevent the insulating material from entering the boundary regions. After the insulator is deposited, the top surface of the light-emitting section can be planarized to facilitate the bonding to the base section if the bonding process requires a more planar surface. Chemical/mechanical polishing (CMP) can be utilized to provide a more planar surface if necessary.

Refer now to FIGS. 7 and 8, which illustrate the fabrication of the base section discussed above. FIG. 7 is a top view of a portion of a base section 80, and FIG. 8 is a cross-sectional view through line 8-8 shown in FIG. 7. The base section can be constructed on any suitable substrate 81. In the examples shown above, the base section does not include any electrical components other than the conductors that make connections to the electrodes on the bottom surface of the base section. Hence, any insulating substrate that provides the required structural strength and that provides a surface on which the conductors can be fabricated can be used. However, embodiments in which the base section includes circuit elements can also be constructed. In this case, the substrate will depend on the nature of the included circuit elements and the fabrication process used to create them. For example, silicon substrates are attractive candidates for applications requiring silicon-based circuit elements.

Base section 80 includes electrodes on the top and bottom surfaces thereof that are connected together by vertically running conductors. The vertical conductors are, in general, fabricated by etching vias that extend from the top to the bottom surfaces of substrate 81 and filling those vias with an appropriate conducting material. The electrodes on the top surface of base section 80 provide connections to corresponding electrodes on the light-emitting section. In general, there are two such electrodes corresponding to each LED. These electrodes are shown at 82 and 83. As will be explained in more detail below, electrode 83 provides the connection to the n-type layer in the LED, and electrode 82 provides the connection to the p-type layer. The areas between the electrodes on the top surface of the base section can, optionally, be filled with an insulating material as shown at 86 and 87. If the areas between electrodes 82 and 83 are filled with insulator, then embodiments in which the areas shown at 87 are also filled are easily constructed since this area can be filled in the same operation. After the insulator is deposited, the top surface of base-section 80 can, optionally, be planarized using a process such as CMP. Whether or not the surfaces need to be planarized depends on the extent to which the process used to bond the base section to the light-emitting section can accommodate uneven surfaces.

As noted above, the electrodes on the top surface of base section 80 are connected to corresponding electrodes on the bottom surface. Electrode 82 is connected to electrode 85 by metal filled via 88. Electrode 83 is preferably the top surface of metal filled via 89, which is connected to electrode 84 on the bottom surface. To clarify the shape of the electrodes on the bottom surface, these electrodes are shown in phantom in FIG. 7.

In one embodiment, the base section is constructed from a conventional silicon wafer that has been thinned to the desired thickness. In this embodiment, the via holes are first etched using reactive ion etching through the wafer. Using a thermal oxide process, an insulating layer of silicon dioxide forms over the entire exposed surface of the silicon wafer including the via holes. A small amount of metal is deposited on the via hole surfaces from which plating can be used to increase the thickness of the this vertical via conductor. Although, the via does not have to be completely filled with metal, it can be. A typical metal used for plating these via holes is copper. As the plating process can result in an uneven surface around the via holes, both surfaces of the wafer are planarized using CMP. The CMP does not remove the Silicon dioxide insulating layer. After planarization, the top and bottom patterned metal layers are deposited on the silicon dioxide layer.

It should also be noted that the vias do not need to be completely filled with the metal. A metal layer that lines the inside of the vias and has a sufficient thickness is sufficient to provide the vertical connections between the metal layers on the top and bottom surfaces of the base section.

The light emitting section and the base section are prepared at the wafer level. These two sections are then bonded together and further processing is performed on the light-emitting section to complete the electrical connections to the base section.

Figure 9:
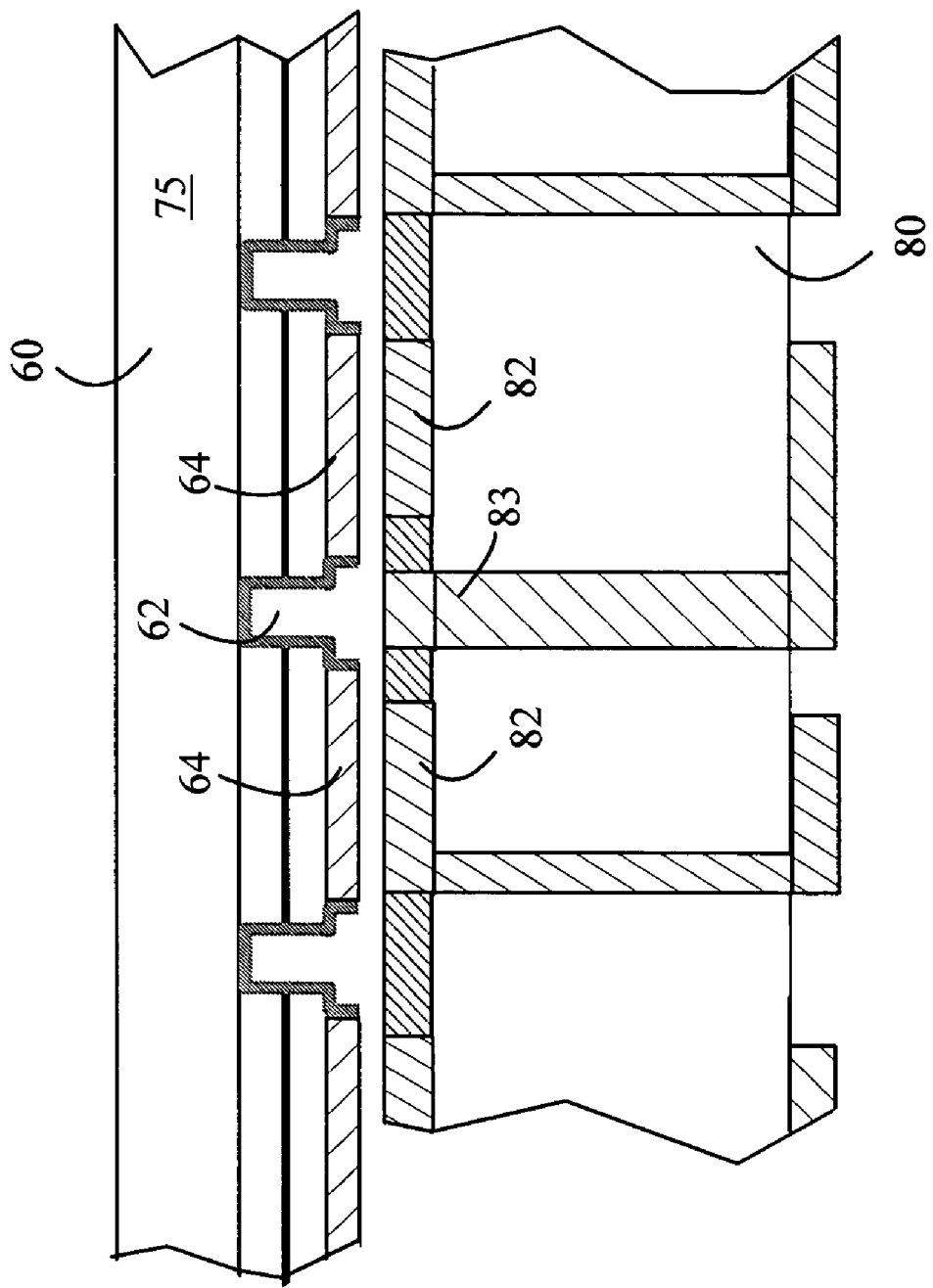
FIG. 9 is a cross-sectional view of the portions of the light-emitting section and base section prior to bonding.

Refer now to FIG. 9, which is a cross-sectional view of the portions of the light-emitting section and base section described above, just prior to bonding. The light emitting section is turned upside down and positioned such that the vias shown at 62 are positioned above the ends of electrodes 83. The electrodes shown at 64 on light-emitting section 60 are positioned adjacent to the corresponding electrodes 82 on the base section.

Figure 10:
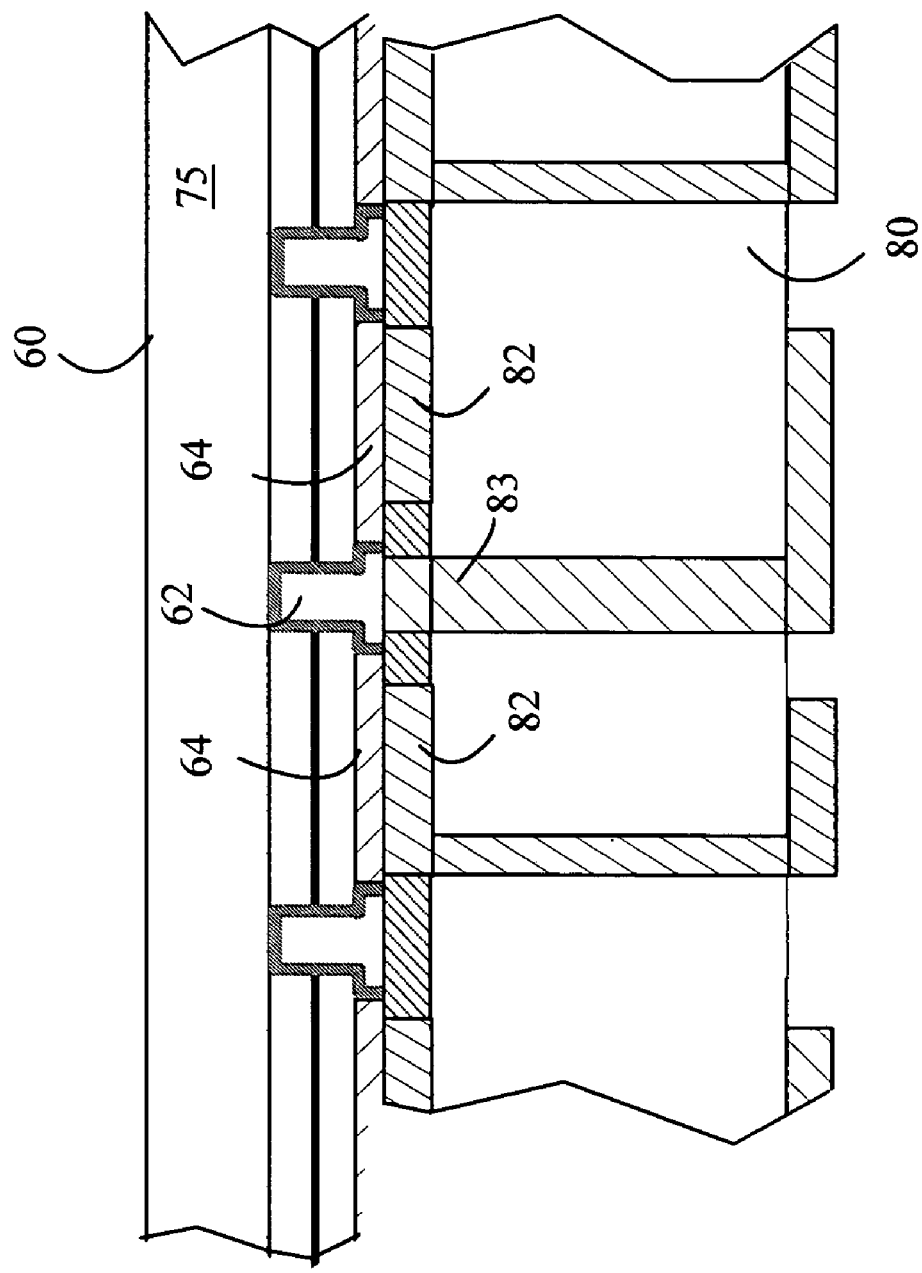
FIG. 10 is a cross-sectional view of the base section and light-emitting sections after the two sections have been bonded.

Refer now to FIG. 10, which is a cross-sectional view of the base section and light-emitting sections after the two sections have been bonded. The electrodes on each section are bonded to the corresponding electrodes on the other section. Any suitable bonding procedure can be utilized. The bonding operation is preferably carried out at the wafer level. Wafer scale bonding techniques are known in the art, and hence, will not be discussed in detail here. For the purposes of the present discussion, it is sufficient to note that techniques that utilize thermal compression bonding are particularly useful for bonding the sections in the present invention. These techniques involve pressing the two sections together and heating them so that the corresponding metal pads on each section are bonded. Thermal compression bonding has been described for pads constructed from copper, gold, and aluminum. In addition, the areas that correspond to insulators that have planar surfaces that are juxtaposed to other planar insulator surfaces can also be utilized if the insulators are constructed from silicon oxide. Finally, bonding techniques in which one of the surfaces being bonded is covered with an appropriate solder can also be utilized.

Figure 11:
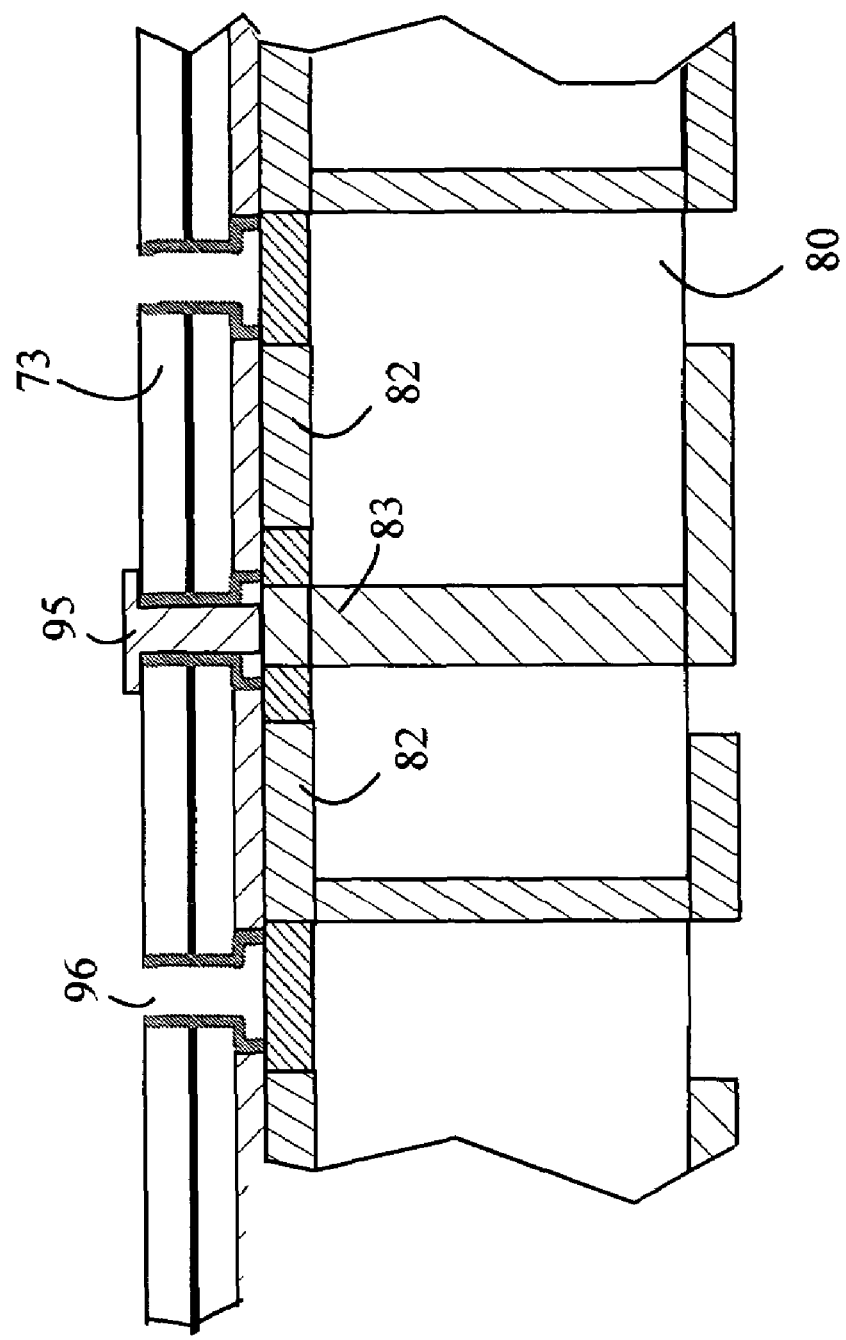
FIG. 11 is a cross-sectional view of the light-emitting and base sections after the two sections have been bonded and the substrate has been removed.

Refer now to FIG. 11, which is a cross-sectional view of the light-emitting and base sections after the two sections have been bonded and substrate 75 has been removed. The manner in which substrate 75 is removed will, in general, depend on the composition of substrate 75. In the case of GaN based LEDs on a sapphire substrate, the substrate can be separated from the GaN layers by illuminating the GaN layers through the sapphire substrate with a light source that emits light at a wavelength that is not significantly absorbed by sapphire but is strongly absorbed by GaN. The energy from the light source is concentrated at the GaN-sapphire boundary where it causes the Ga to liquefy along the sapphire interface. The sapphire substrate can then be removed from the GaN layers, which remain attached to the base section. Such a process is known as laser lift off and described in the U.S. Pat. Nos. 6,071,795, 6,420,242, and 5,335,263. The process is particularly well suited for cases in which the light-emitting section is constructed from AlGaAs, AlInGaP, AlInGaN, or GaAsP. It should be noted that the semiconductor section in such a device could have a thickness that is less than 10 μm.

If the substrate is removed by CMP, a portion of the n-type layer 73 can also be removed leaving the ends of the vias open as shown in FIG. 11. If the substrate was removed using the laser lift off scheme discussed above, the insulating material that blocks the end of the vias must be removed in an additional processing step. For example, the layer 73 could be masked and an etchant applied to remove the end portion of the insulator. Alternatively, the exposed layer could be subjected to CMP to remove the insulator at the end of the via. Any suitable method that leaves the insulating layer intact in the regions corresponding to the active layer and the p-type layer can be utilized.

After the vias for the n-type electrode connection have been re-opened, a metal is deposited onto and into these insulated via holes in the GaN to complete the connection between layer 73 and electrode 83 as shown at 95. The openings 96 in the boundary regions can optionally be filled with metal or the photoresist layer used in the deposition of metal connection 95. In one embodiment, the openings in the boundary region are left open during the final metalization. A layer of clear insulator is then deposited over layer 73. The layer then fills boundary regions 96 to provide the encapsulation layer shown in FIG. 3 at 49. To facilitate the dicing of the wafer into individual dies, a portion of region 96 along the scribe lines can be left without encapsulation.

Refer again to FIG. 3. Electrode 45 supplies the electrons to layer 41 during the operation of LED 40, and electrode 44 supplies the holes. The currents in question ideally spread out such that the electrons and holes are uniformly distributed over the surface of active layer 43. This goal is substantially achieved for the holes injected by electrode 44 into layer 42, since electrode 44 covers most of the surface of layer 42. In contrast, electrode 45 covers only a small portion of the surface of layer 41, and hence, the distribution of electrons in layer 41 could be substantially less than desired.

In one embodiment of the present invention, this problem is addressed by using a top electrode that includes a plurality of thin spokes that more evenly distribute the current over the surface of layer 41. Refer now to FIG. 12, which is a top view of another embodiment of an LED according to the present invention. LED 100 has a top layer 101 that is analogous to layer 41 discussed above. Electrode 102 is connected through the light emitting layers by a metal filled via 103 in the center of layer 101. A number of thin electrodes 102 extend outward from via 103 to provide direct current paths to other portions of layer 101. Since light is emitted through layer 101, the dimensions of the spokes and the number of such spokes are chosen to minimize any loss of light caused by reflection or absorption by the metal in the spokes. While the thin electrodes are arranged in a radial pattern, it should be noted that other patterns can be utilized provided the electrodes do not block a significant portion of the surface while evenly spreading the current. In one embodiment of the present invention, the area of the light-emitting surface covered by the thin electrodes is less than 20 percent of the light emitting area.

The above-described embodiments of the present invention have utilized a configuration in which the n-type layer is on the top surface of the completed chip and acts as the surface through which light is emitted. This configuration conforms to the most common method for fabricating LEDs in which the n-type layer is deposited first on the substrate to minimize problems associated with the p-type dopants defusing into the other layers.

This configuration also takes advantage of the observation that the p-type layers in many material systems have significantly higher resistivity than the n-type layers, and hence, current spreading to provide a uniform charge density at the active layer is a more significant problem with the p-type layer. As noted above, in the above-described embodiments, the p-type layer is in contact with the large bottom electrode, and hence does not have significant problems related to non-uniform currents across that layer.

However, the present invention can be utilized with other LED configurations. To simplify the following discussion, the layer through which the light is emitted will be referred to as the top layer of the LED, and the layer that is in contact with the base section will be referred to as the bottom layer. These designations will be used independent of the doping of the particular layers. For example, in some material systems used to make LEDs, the p-type layers can be deposited first without significant diffusion problems. In this case the top layer would be the p-type layer.

In the above-described embodiments of the present invention, the LEDs are simple three layer devices in which the active layer is sandwiched between a p-type layer and an n-type layer. In practice the three layers may each comprise a plurality of layers with different alloy compositions and doping levels to improve properties such as light output, ohmic contact, efficiency and current spreading. These structures are well known to those skilled in the art.

In the above-described embodiments of the present invention, the LEDs are simple three layer devices in which the active layer is sandwiched between a p-type layer and an n-type layer. The resulting structure is often referred to as a p-i-n diode. As noted above, in many material systems, the p-type layer causes problems both in terms of current spreading and resistance. In this regard it should be noted that the n-type and p-type layers may be viewed as resistors that dissipate power, and this dissipated power does not generate any light. Accordingly, high resistance layers result in lower efficiencies and high operating temperatures. More complex LED designs attempt to reduce these problems by minimizing the thickness of the p-type layer. In these devices, the other layers of the device are both n-type layers to provide better current spreading. Since such LEDs are known in the art, they will not be discussed in detail here. For the purposes of the present discussion, it is sufficient to note that a tunnel diode junction is introduced with the body of the LED to provide a transition of a p-type layer. That is, the LED has an n-p-i-n structure, in which the n-p junction is a reverse-biased tunnel diode, and the p-type layer is relatively thin. Since the current spreading function is achieved in the n-type layers, the p-type layer can be quite thin, and hence, the problems associated with high resistance of p-type materials are significantly reduced. For the correct choice of materials and dopings, it can be shown that the losses introduced by the tunnel junction are more than offset by improvements in current spreading and lower device resistance.

In the above-described embodiments of the present invention, the top layer of the light-emitting section is connected to a corresponding electrode on the top surface of the base section by way of a metal filled via that extends from the top surface of the LED to the bottom surface of the LED through the LED, which, it turn, is connected to a pad on the bottom surface of the base-section. However, other modes for connecting the top layer of the LED to an electrode on the bottom surface of the base section can be utilized.

Refer now to FIGS. 13 and 14, which illustrate another embodiment of an LED according to the present invention. FIG. 13 is a top view of LED 200, and FIG. 14 is a cross-sectional view of LED 200 through line 14-14 shown in FIG. 13. LED 200 includes a light emitting section 210 and a base section that perform functions analogous to those described above with respect to LED 40. Light emitting section 210 includes an active region 212 sandwiched between a p-type layer 213 and an n-type layer 211. Electrical contact to layer 213 is provided by electrode 217, which is deposited on the surface of layer 213. Electrical contact to layer 211 is provided by electrode 215 which is deposited on layer 211 after the light emitting section has been bonded to base section 220.

Base section 220 includes a number of electrodes that are deposited on an insulating substrate 221. Electrodes 223 and 224 provide contacts for connecting electrodes 217 and 215 to an external circuit. Electrode 214 is deposited on substrate 221 before light-emitting section 210 is bonded to base section 220. Electrode 214 bonds the two sections together and provides part of the electrical path that connects layer 213 to electrode 223. The remaining portion of this path is provided by a vertical conductor 222. Similarly, a vertical conductor 218 is used to complete the connection between electrode 215 and electrode 224.

Figure 16:
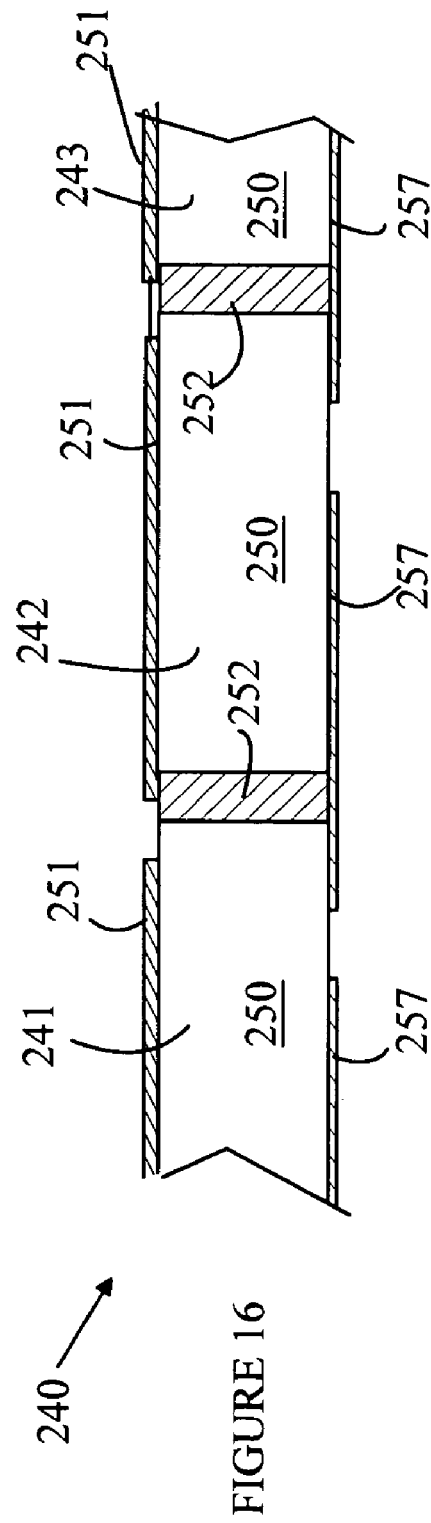
FIG. 16 is a cross-sectional view through line 16-16 shown in FIG. 15.
Figure 15:
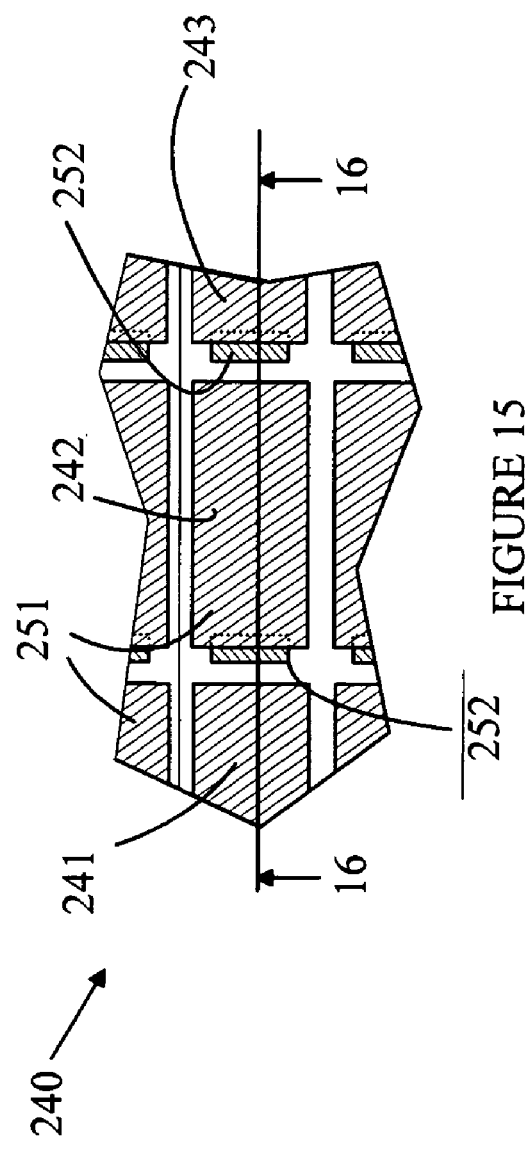
FIG. 15 is a top view of a base section wafer according to the present invention.

The manner in which an LED having the configuration of LED 200 is fabricated will now be discussed in more detail. Refer first to FIGS. 15 and 16, which illustrate a portion of a base section wafer 240 that is ready to be bonded to a light-emitting section wafer. FIG. 15 is a top view of wafer 240, and FIG. 16 is a cross-sectional view of wafer 240 through line 16-16 shown in FIG. 15 showing part of three base elements 241-243. Wafer 240 is constructed on an insulating substrate 250. The deep trenches shown at 252 are first etched and coated with metal to provide electrical connections between the top and bottom surfaces of substrate 250. Optionally, these trenches can be completely filled with metal. In the example shown in these figures, the trenches are rectangular in cross-section; however, other shapes could be utilized. After the trenches have been etched, patterned metal layers 251 and 257 are deposited on the top and bottom surfaces of substrate 250 to provide the various electrodes associated with the base section of each device.

The light-emitting section is prepared in a manner analogous to that described above with reference to FIGS. 5 and 6, and hence, that discussion will not be repeated here. It is sufficient to note that in the present example, the vias shown at 62 in FIGS. 5 and 6 are not fabricated.

Figure 17:
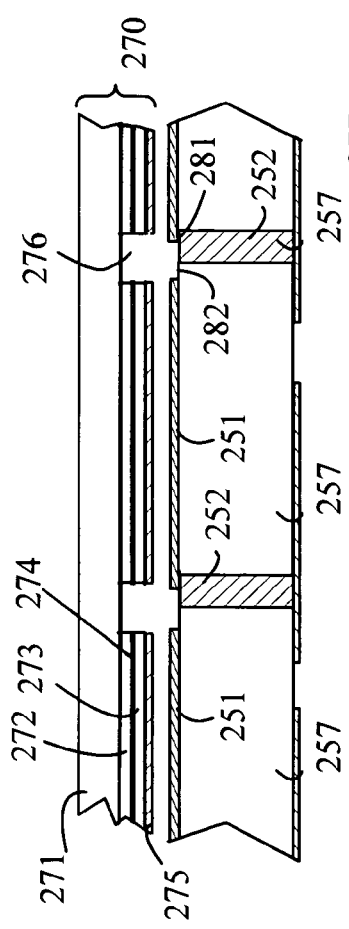
FIGS. 17-20 illustrate the manner in which an LED having the configuration of LED 200 is fabricated.

Refer now to FIGS. 17-20, which illustrate the manner in which an LED having the configuration of LED 200 is fabricated. The process starts by bonding a wafer having the light-emitting sections to a wafer having the base sections. FIG. 17 shows the two wafers just prior to bonding while the wafers are aligned but still separated. Light emitting wafer 270 includes an active layer 274 that is sandwiched between a p-type layer 273 and an n-type layer 272 that have been deposited on a substrate 271. Light-emitting wafer 270 also includes a patterned electrode layer 275 that provides an electrical connection to layer 272. Trenches 276 have been etched through layers 272-275.

The two wafers are such that electrodes 275 and 251 are bonded together in each of the LEDs and the gaps between electrodes 251 are aligned within the trenches shown at 276. It should be noted that a portion of trench 252 underlies a portion of electrode 251 in each of the devices as shown at 281 such that trench 252 makes electrical contact with electrode 251 at that location. The remaining portion of trench 252 does not make contact with electrode 251, and hence, there is a non-conducting gap 282 between trench 252 and the portion of electrode 251 corresponding to the neighboring devices in the wafer.

Figure 18:
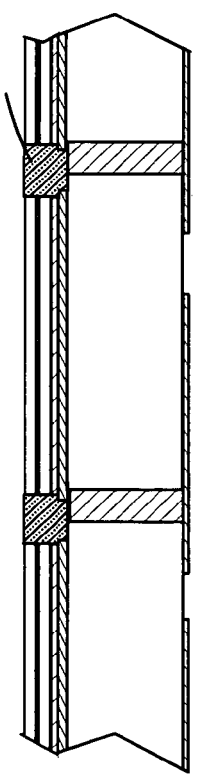
Figure 19:
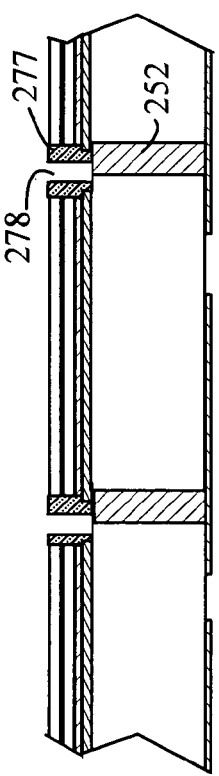
Figure 20:
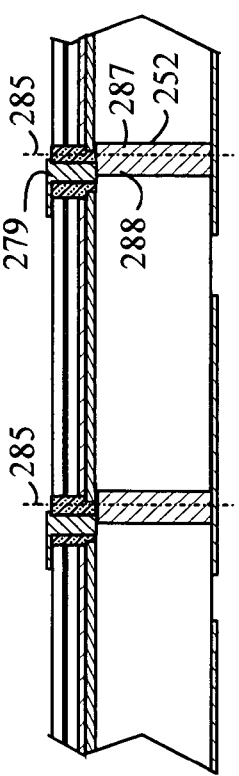

Refer now to FIG. 18. After the wafers have been bonded, substrate 271 is removed and trenches 276 are filled with an insulator such as SiO2 as shown at 277. A trench 278 is etched in insulator 277 as shown in FIG. 19. The trench overlies a portion of trench 252. Trench 278 can extend the length of trench 252 or only a portion of that length. A patterned electrode 279 is then deposited over a portion of layer 272 as shown in FIG. 19. Electrode 279 also extends into trench 278. One or more additional layers of transparent material can be applied over the wafers to protect the top surface if needed. To simplify the drawings, these layers have been omitted.

In the final step in the fabrication process, the devices are singulated by cutting the bonded wafers. In one embodiment, the devices are cut along line 285 shown in FIG. 20. This cut divides trench 252 into two vertically running electrodes 287 and 288. Electrode 287 becomes electrode 222 shown in FIG. 14, and electrode 288 becomes electrode 218 shown in FIG. 14.

Figure 21:
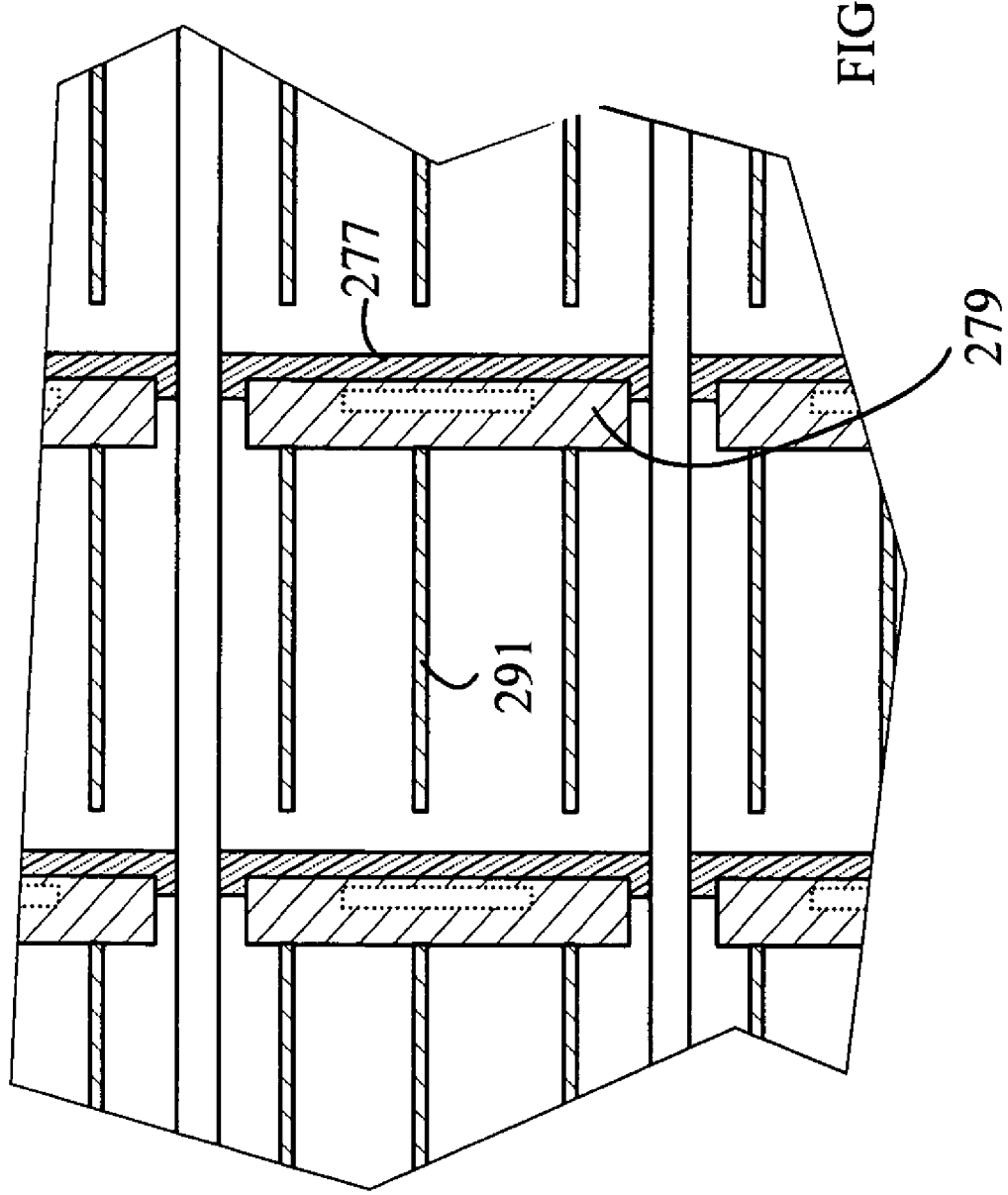
FIG. 21 is a top view of a portion of the bonded wafers just prior to cutting the bonded wafers.

Refer now to FIG. 21, which is a top view of a portion of the bonded wafers just prior to cutting the bonded wafers. As noted above, the top electrode 279 can include a number of linear conductors 291 that spread the current over the top surface of the light-emitting device.

In the above-described embodiments, an insulating layer protects bottom layers from being shorted to the vertical conductor that makes the connection from the base section to the top layer of the device. In the examples discussed above, the insulating layer extends to the top surface of the top layer. However, it should be noted that the insulating layer does not need to extend all of the way to the top surface. The present invention will function so long as the insulating layer covers the portions of the bottom layer and active layer such that the vertical conductor does not short to one of those layers.

While the present invention has been described in terms of a light-emitting device that is an LED, embodiments of the present invention in which the device that is bonded to the base section is a different integrated circuit or circuit element can also be constructed. To simplify the following discussion, the term integrated circuit is defined to include devices consisting of an individual circuit element. The present invention is particularly useful in cases in which the device being mounted on the base section requires a first contact on the top surface of the device and a second contact on the bottom surface of the device and the device has one or more layers that must be protected from shorting to the conductor that makes the connection to the top surface of the device. For example, VCSELs have such a structure, and hence, can be combined with a base section to provide a surface mountable VCSEL according to the present invention.

It should also be noted that the base section of a device according to the present invention has an area that is approximately the same size as the area of the final device, and hence, the final devices can be placed much closer together than integrated circuit devices consisting of dies or chips that are mounted in conventional integrated circuit packages. The present invention is particularly useful in providing a surface mountable chip in which the base section is less than two times the surface area of the top surface of the integrated circuit chip or die.

The present invention is particularly useful in constructing devices in which the circuit device is constructed from the AlGaAs, AlInGaP, AlInGaN, or GaAsP families of materials mounted on a silicon or ceramic substrate. As noted above, GaN device layers can be separated from an underlying sapphire substrate utilizing laser irradiation. In addition, silicon substrates provide effective heat transfer, and hence, are well suited for high power devices.

The above-described embodiments of the present invention have been directed to circuit devices having two electrodes, one on the bottom surface and one on the top surface. In this case, the base section also includes two corresponding electrodes that connect to the circuit device electrodes and terminate in pads on the bottom surface of the finished chip. However, devices having more than two device electrodes and more than two conductive pads on the bottom surface of the base section can also be constructed.

The embodiments of the present invention described above utilize single layer electrodes on the LED and on the top surface of the base layer. However, embodiments in which one or more of these electrodes includes multiple layers can also be constructed. Furthermore, the multiple layers can include insulating sub-layers with different spatial patterns that are connected by vertical connections between the layers. For example, such layers are useful in cases in which the LED has multiple contact points on its surface that must be routed to locations on the base layer that are not directly under the contacts in question.

In addition, such layers are useful in cases in which the vertical connectors have very large diameters. If a thick base section is utilized, the minimum size of the vertical vias is set by the etching process used to cut the vias. Since these processes place limits on the aspect ratio of the etched holes that typically limit the vias diameter to be greater than ¼ of the via hole depth, the size of the top surface of the via can be relatively large and impose constraints on the size and placement of the bottom electrode on the LED. This problem can be mitigated by covering the top surface of the base section with a thin insulating layer having a smaller via over the end of the larger metal filled via. An electrode of the desired size and position can then be deposited on this insulating layer.

Figure 22:
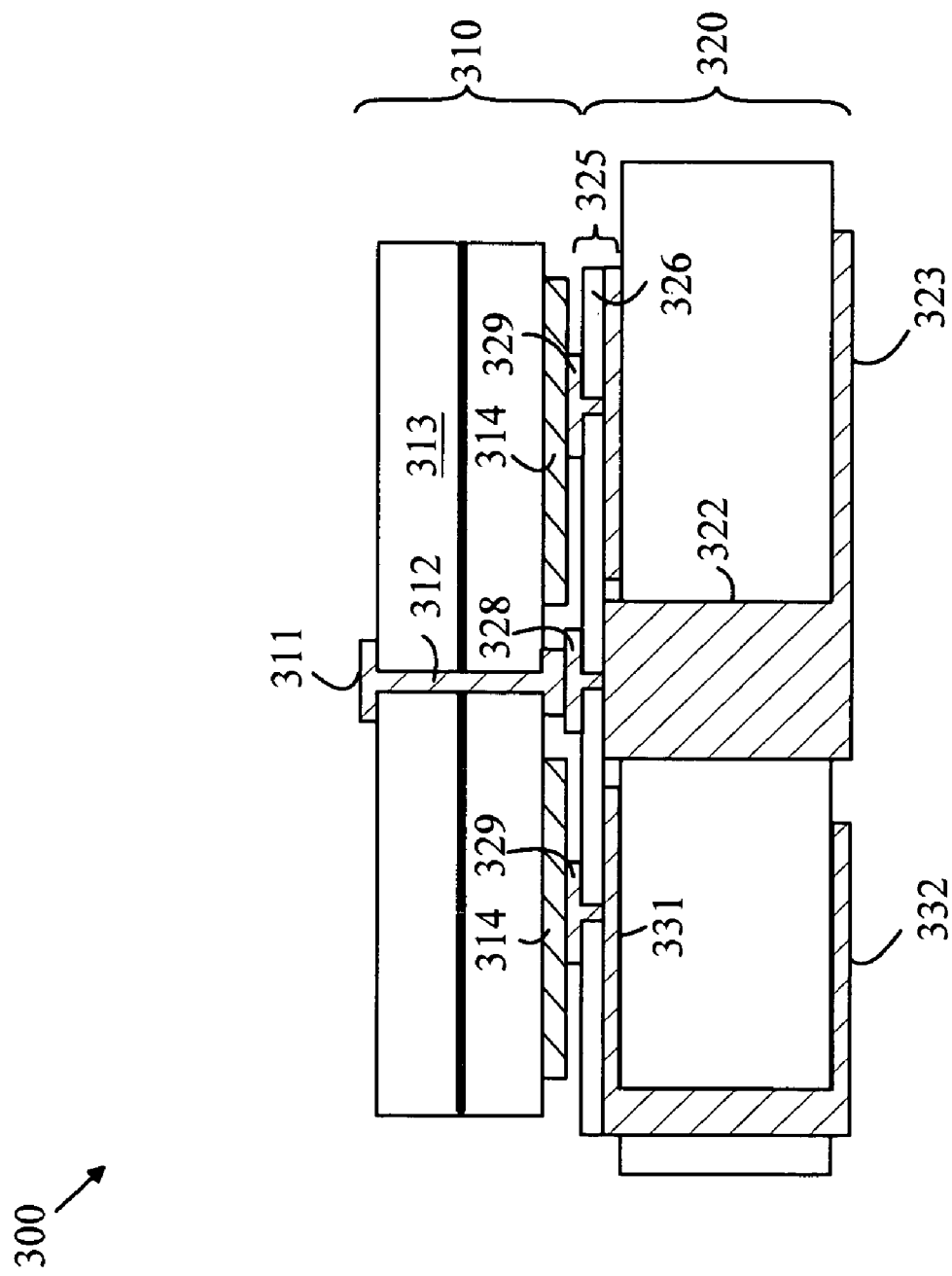
FIG. 22 is a cross-sectional view of an LED according to another embodiment of the present invention.

Refer now to FIG. 22, which is a cross-sectional view of an LED according to another embodiment of the present invention. LED 300 includes a light emitting section 310 that is analogous to the light emitting sections discussed above. The connection to layer 313 is provided by electrode 311 that is connected to vertical conductor 312. To simplify the drawing the insulating layer within the via through which vertical conductor 312 passes has been omitted from the drawing. Vertical conductor 312 preferably has as small a cross-sectional area as is consistent with providing an electrical connection of the required capacity to layer 313.

Electrode 311 is connected to bottom electrode 323 by metal filled via 322. As noted above, the minimum diameter of the vias is determined by the thickness of the layers through which the vias are etched. Light-emitting section 310 is typically much thinner than base section 320. For example, light-emitting section 310 can be 10 μm. In contrast, base-section 320 must be thick enough to prevent breakage of the final part, and hence, typically has a thickness that is greater than 100 μm. Hence, via 322 is typically much wider than via 312. In some cases, via 322 is so wide that the size of electrode 314 would need to be limited to prevent shorts to the metal in via 322. However, it is advantageous to provide as large an electrode on the bottom surface of the light emitting section as possible to optimize the current spreading within the light emitting section. The embodiment shown in FIG. 22 overcomes this problem by utilizing a three layer top electrode 325 having two patterned metal layers separated by an insulting layer 326. The top metal layer is patterned to provide electrodes 328 and 329. Electrode 328 provides the connection to via 322 through a small via in layer 329, and hence, provides the transition from via 312 to via 322 without placing significant restrictions on the size of electrode 314. Electrode 329 provides the connection between electrode 314 and electrode 332 via electrode 331 that is patterned in the bottom layer of electrode 325.

The above-described embodiments of the present invention utilize metal filled vias to implement the vertical conductors. However, other forms of vertical conductors can be utilized. For example, vertical conductors that utilize appropriately doped silicon can also be utilized. Such structures are known to the art, and hence, will not be discussed in detail here.

Various modifications to the present invention will become apparent to those skilled in the art from the foregoing description and accompanying drawings. Accordingly, the present invention is to be limited solely by the scope of the following claims.

What is claimed is:

1. A device comprising a circuit device and a base section, said circuit device comprising a plurality of semiconductor layers including a top layer and a bottom layer, said top layer comprising a top surface having a top contact thereon and said bottom layer comprising a bottom surface and a bottom contact on said bottom surface, said circuit device requiring a potential difference between said top contact and said bottom contact to operate, and said base section comprising a substrate having a top base surface and a bottom base surface, said top base surface being bonded to said bottom layer and said bottom base surface comprising first and second bottom electrodes that are electrically isolated from one another, said bottom contact being connected to said first bottom electrode by a first conductor and said second bottom electrode being connected to said top contact by a second conductor, wherein said bottom layer comprises an insulating layer bonded to a surface thereof, and wherein said second conductor comprises a layer of metal bonded to said insulating layer, said insulating layer preventing contact between said second conductor and said bottom layer.

2. The device of claim 1 wherein said base section comprises a top electrode bonded to said top base surface, said first conductor comprises a conductor that connects said top electrode to said first bottom electrode.

3. The device of claim 2 wherein said circuit device comprises a light-emitting device comprising an active layer, and first and second semiconductor layers, said active layer disposed between said first and second semiconductor layers, said first layer having a top surface comprising said top contact and said second layer having a bottom surface comprising said bottom contact, said light-emitting device generating light when holes and electrons combine therein in response to a potential being applied between said top and bottom contact.

4. The device of claim 3 wherein said circuit device comprises AlGaAs, AlInGaP, AlInGaN, or GaAsP.

5. The device of claim 1 wherein said substrate comprises a silicon wafer or a ceramic material.

6. The device of claim 3 wherein said light-emitting device comprises an LED.

7. The device of claim 3 wherein said light-emitting device comprises a laser diode.

8. The device of claim 3 wherein said light-emitting device comprises a via extending from said top surface of said first semiconductor layer to said bottom surface of said second semiconductor layer, said via comprising a layer of metal electrically isolated from said second semiconductor layer and said active layer by said insulating layer and said active layer.

9. The device of claim 3 wherein said first semiconductor layer, said active layer, and said second semiconductor layer comprise an outer surface and wherein said insulating layer comprises an insulating layer bonded to said outer surface.

10. The device of claim 3 wherein said top contact covers less than 20 percent of said first semiconductor layer.

11. The device of claim 1 wherein said circuit device is less than 10 μm thick.

12. The device of claim 1 wherein said bottom contact comprises a mirror with greater than 50 percent reflectivity.

13. The device of claim 3 wherein the base section is 5 times thicker than the thickness of said circuit device.

14. The device of claim 1 wherein said second conductor comprises a metal via connecting said top base surface to said second bottom electrode.

15. The device of claim 2 wherein said first conductor comprises a metal via connecting said top electrode to said first bottom electrode.

16. The device of claim 1 wherein said bottom surface of said base section has an area that is less than two times the area of said top surface of said second semiconductor layer.

* * * * *